United States Patent [19]

Schneiter et al.

[11] 4,375,621

[45] Mar. 1, 1983

[54] CIRCUIT FOR LINEARIZING FREQUENCY MODULATED OSCILLATORS ON MICROSTRIP

[75] Inventors: Andres F. Schneiter, Maple Ridge; Josef L. Fikart, Port Coquitlam, both of Canada

[73] Assignee: AEL Microtel, Ltd., Burnaby, Canada

[21] Appl. No.: 239,759

[22] Filed: Mar. 2, 1981

[51] Int. Cl.³ .................... H03B 5/18; H03C 3/08; H03C 3/22

[52] U.S. Cl. .................... 332/16 T; 331/117 D; 331/177 V; 332/18; 332/19; 332/30 V

[58] Field of Search .................... 332/16 R, 16 T, 18, 332/19, 30 V; 331/36 C, 96, 99, 100, 107 SL, 117 D, 177 V

[56] References Cited

U.S. PATENT DOCUMENTS

| | | |
|---|---|---|
| 3,747,032 | 7/1973 | Hall et al. .................... 332/30 V |
| 4,123,726 | 10/1978 | Schucht .................... 331/117 D X |
| 4,189,690 | 2/1980 | Bock et al. .................... 332/30 V |
| 4,310,809 | 1/1982 | Buck et al. .................... 331/117 D |

OTHER PUBLICATIONS

Bock et al., "An RF Linear Modulation Circuit", IEEE-MTT-S International Microwave Symposium Digest, pp. 315-317, Ottawa, 1978.

Marazzi et al., "Computer-Aided Design of Highly Linear, High-Power Varactor Tuned Frequency Modulators", IEEE-MTT-S International Microwave Symposium Digest, pp. 88-90, Ottawa, 1978.

*Primary Examiner*—Siegfried H. Grimm
*Attorney, Agent, or Firm*—Leonard R. Cool

[57] ABSTRACT

In a microstrip frequency modulated oscillator, the linearity of the modulating circuit incorporating a varactor diode is adjusted by using a microstrip transmission line as a secondary resonator in conjuction with a variable reactor. The varactor is connected to one end of this resonator which end is also connected to the main resonator of the microstrip oscillator. The variable reactor is connected between the other end of the secondary resonator and ground.

4 Claims, 2 Drawing Figures

CIRCUIT FOR LINEARIZING FREQUENCY MODULATED OSCILLATORS ON MICROSTRIP

BACKGROUND OF THE INVENTION

This invention relates to an arrangement for frequency-modulating an oscillator by applying a modulation voltage to a varactor diode, and particularly to such an arrangement for providing a more linear relationship between the oscillator frequency and the voltage applied to the varactor diode.

Varactor diodes are commonly used for frequency modulating high-frequency oscillators. Typically, a varactor diode is connected into the frequency-determining circuit of the oscillator, and the oscillator frequency varies because the capacitance of the varactor diode is varied as a function of the voltage applied to it. Thus as the diode capacitance varies, the oscillator frequency also varies, but not necessarily in a linear manner with respect to the modulating voltage.

The basic problem is to compensate the inherent non-linearity of the varactor modulator, without affecting the efficiency, noise performance, frequency and tunability of the oscillator. Typical of previous solutions employed are those disclosed in U.S. Pat. No. 3,747,032, issued July 17, 1973 to inventors James A. Hall and Harry J. Peppiatt and is titled "Arrangement for Providing Improved Linearization of the Voltage-Frequency Characteristic of a Resonant Circuit Having a Voltage-Variable Capacity Diode". In this case the diode is coupled through a one-third wavelength transmission line to a resonant cavity. The capacitance of the diode is varied by the modulating voltage changing the resonant frequency of the cavity, and hence the resonant frequency of the oscillator. The transmission line causes the resonant frequency of the cavity to vary more linearly over a relatively wide band as a function of the modulating voltage. In coaxial frequency modulated oscillators which employ varactors, a first resonator in the form of a coxial cavity is connected to the collector transistor with a sliding short at the cavity which controls the rest frequency of the oscillator. A second resonator circuit is terminated by a sliding short on one end and a varactor on the other. The second resonator is capacitively coupled to the main resonator. The amount of coupling will determine the deviation and with the sliding short the linearity is adjusted.

The above described circuits are realized in mechanical configuration which require expensive manufacturing because of tight tolerances, fine threads and, for the coaxial circuit, gold plating of large areas to reduce the electrical loss of the cavities. Because air is used as a dielectric medium, the units tend to be large and bulky. They are also susceptible to vibrations and shock (microphonics). Further, the electrical arrangement required has the output coupling of the main resonator closer to the modulation resonator which makes the linearity very susceptible to changes by changing output coupling and load. Typically the linearity and frequency adjustments are highly interdependent.

In order to eliminate some of the above-mentioned drawbacks, oscillators and consequently their modulation circuits have recently been realized in microstrip form which generally reduces the size of such units. Typical of the state of the art are circuits described in "An RF Linear Modulation Circuit" by G. Bock and B. Walsh, IEEE-MTT-S International Microwave Symposium Digest, pp. 315–317, Ottawa, 1978; and "Computer Aided Design of Highly Linear, High Power Varactor Tuned Frequency Modulators" by E. Marazzi and V. Rizzoli, IEEE-MIT-S International Microwave Symposium Digest, pp. 88–90, Ottawa, June 1978.

In the first circuit, the modulation circuit is part of the output matching circuit which has the disadvantage of making the linearity very susceptible to the impedance of the load. The linearization circuit disclosed by Rizzoli is decoupled from the oscillator output but the frequency determining resonator, to which the modulation circuit is connected, is still realized in coaxial form. Neither of these circuits is meant to provide a significant *linearity adjustment,* unless the varactor bias is adjusted, thereby also changing the frequency. This makes it impossible to compensate for linearity slopes originating in other parts of a system, e.g., in the modulation amplifier of a transmitter.

The present invention solves the problem of physical size and interdependence of linearity adjustment and frequency. In the instant invention a very simple linearization circuit is completely realized in microstrip and the same varactor (modulation varactor) can be used for frequency control purposes (such as an automatic phase lock loop) since the varactor bias is not used for linearity adjustment and is essentially independent therefrom. Further, the linearity adjustment may be done remotely by adjusting the bias of a second varactor.

SUMMARY OF THE INVENTION

A technique for linearizing a varactor modulation circuit in a frequency modulated oscillator includes a secondary resonator in combination with a variable reactor. The resonator is a microstrip transmission line having a length defined by $\lambda/4$. The variable reactor provides a capacitive reactance and is connected between one end of the transmission line and ground. The varactor is connected to the other end of the transmission line which end is also connected to the main resonator of the oscillator.

DETAILED DESCRIPTION OF PREFERRED EMBODIMENT

Figure 1:
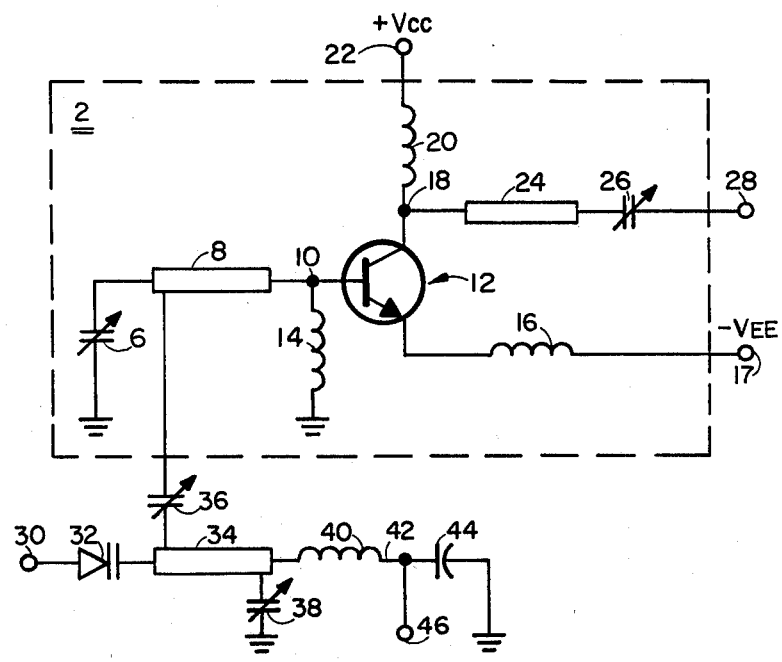
FIG. 1 illustrates the microstrip linearization circuit (4), which employs a reactor (38) in conjunction with a voltage controlled oscillator (2)

Referring now to FIG. 1, it may be seen that voltage controlled oscillator (VCO) 2 is a single transistor microstrip oscillator. In this circuit the transistor is employed in a common base configuration in which the frequency determining circuit and the output circuit are separated and therefore relatively independent. Normal collector and emitter biasing voltages are applied to terminals 17 and 22 as shown. The output of the voltage controlled oscillator is from the node 18, collector connection via resonator 24 and variable capacitor 26. Capacitor 26 is adjustable to permit matching of the output circuit with the load. The frequency of the voltage controlled oscillator 2 is mainly determined by a microstrip main resonator 8 which is connected to the base of the transistor and terminated by variable capacitor 6. 14, 16 and 20 are RF chokes and may consist of either small coils or lengths of high impedance microstrip lines. These chokes decouple the DC circuitry from the oscillator frequency and the modulated frequencies.

The modulation circuit which includes the linearization elements consists of secondary microstrip resonator 34, terminated on one side by a varactor 32 and on the other side by reactor 38, which is used to adjust the linearity. A DC bias voltage for the varactor is applied between terminal 30 and ground. The RF choke 40 completes the DC path for the bias voltage. This bias voltage sets the quiescent point of operation for the varactor and, thus, the point of operation about which the modulation frequency causes the capacitive reactance of the varactor to change. This change is translated to the main resonator 8 via coupling capacitor 36 to shift the oscillator frequency in accordance with the modulation signal input. Capacitor 36 controls the magnitude of this shift, i.e., the deviation sensitivity. Reactor 38 controls the accuracy with which the oscillator frequency changes follow the modulation signal, i.e., it controls linearity. Reactor 38 can be realized either in the form of a variable capacitor or by a varactor and a variable bias voltage source which then controls the linearity of the modulating circuit.

Figure 2:
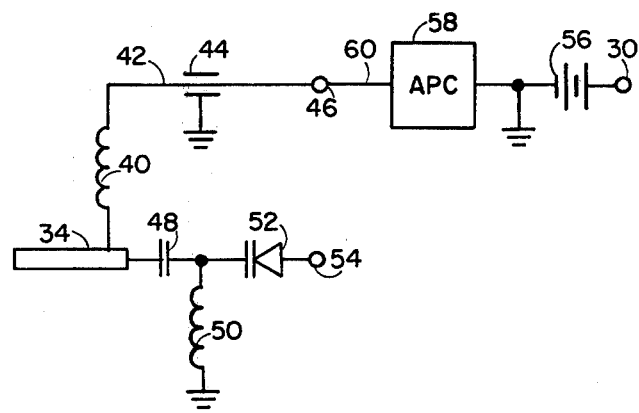
FIG. 2 illustrates how the use of varactor (52) in lieu of reactor (38) may be used to remotely control the linearization circuit.

This circuit configuration is unique in that it can be optimized in such a way as to give a negligible interference between linearity adjustment and frequency; whereas to prior art circuits, linearity and frequency adjustments were highly interdependent. This is especially advantageous where reactor 38 is a varactor (see 52 of FIG. 2) so that the linearity can be remotely controlled without the need for frequency readjustment. Moreover, the modulation varactor 32 may also be used as a frequency control element, since the varactor bias, of 32, does not affect the linearity adjustment. Such bias voltage is applied between terminals 30 and 46 and may include, for example, a fixed bias voltage 56 in combination with the control voltage of an automatic phase control circuit 58. The manner in which this may be done is apparent from this disclosure and could be readily implemented by those skilled in the art.

In the case of a 1500 MHz oscillator element values which provided successful performance were:

for capacitor 36: 0.3 to 1.2 pF variable capacitor
for varactor 32: 2.2 pF at $C_{j\text{-}4}$ (GC-1705-11 from filter devices)
capacitor 38: 0.6 to 4.5 pF variable capacitor
resonator 34: 50 $\Omega$ line $1 = \lambda/4$ While the invention has been particularly shown and described with reference to preferred embodiments thereof, it will be understood by those skilled in the art that change in form and detail may be made therein withough departing from the spirit and scope of the invention.

What is claimed is:

1. Apparatus for linearizing the modulation circuit in a frequency modulated oscillator, comprising:
   a microstrip oscillator having a frequency determining resonator circuit and an output matching circuit;
   a secondary resonator made up of a microstrip transmission line, having first and second ends, and having a length that is approximately equal to one quarter wavelength;
   a source of DC bias voltage having first and second terminals, said second terminal being connected to the second end of said secondary resonator;
   a source of modulting signals having first and second terminals, said second terminal being connected to ground;
   a varactor diode having one terminal end thereof connected to the first terminal of said DC bias voltage and modulating signal sources, and having the other terminal end connected to said first end of said resonator;
   a first variable capacitor having one side connected to said first end of said secondary resonator, having the other side connected to said frequency determining resonator circuit, whereby the deviation sensitivity of said oscillator is controlled; and
   a variable reactor having one side connected to the second end of said secondary resonator, whereby the impedance of the combination of said secondary resonator and said variable reactor may be varied to linearize said frequency modulated oscillator.

2. Apparatus as set forth in claim 1 wherein said variable reactance is a second variable capacitor.

3. Apparatus as set forth in claim 1 wherein said variable reactor comprises:
   a second varactor diode; and
   adjustable bias means connected to the other side of said second varactor for controlling the linearity adjustment.

4. Apparatus as set forth in claim 1 wherein said DC bias voltage source comprises:
   a DC reference voltage source having one terminal end connected to the first varactor; and
   an automatic phase control circuit providing a DC control voltage one terminal end of which is connected to the other end of said DC reference voltage source and the other end is connected to said second end of said secondary resonator.

* * * * *